(12) United States Patent
Cima

(10) Patent No.: US 11,686,745 B2
(45) Date of Patent: Jun. 27, 2023

(54) ROGOWSKI CURRENT SENSOR WHICH IS FAST AND IMMUNE TO VOLTAGE DRIFTS

(71) Applicant: SAFRAN ELECTRICAL & POWER, Blagnac (FR)

(72) Inventor: Lionel Cima, Moissy-Cramayel (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 0 days.

(21) Appl. No.: 17/995,137

(22) PCT Filed: Mar. 24, 2021

(86) PCT No.: PCT/HR2021/050505
§ 371 (c)(1),
(2) Date: Sep. 30, 2022

(87) PCT Pub. No.: WO2021/198590
PCT Pub. Date: Oct. 7, 2021

(65) Prior Publication Data
US 2023/0136151 A1    May 4, 2023

(30) Foreign Application Priority Data

Apr. 2, 2020    (FR) ...................................... 2003329

(51) Int. Cl.
*G01R 15/18*    (2006.01)
(52) U.S. Cl.
CPC .................................. *G01R 15/181* (2013.01)
(58) Field of Classification Search
CPC .... G01R 15/181; G01R 1/203; G01R 15/146; G01R 19/0007

(Continued)

(56) References Cited

U.S. PATENT DOCUMENTS 6,313,623 B1 * 11/2001 Kojovic ............... G01R 15/181
    324/127
2004/0251745 A1 * 12/2004 Baruque Lopez ...... H01F 37/00
    307/43

(Continued)

FOREIGN PATENT DOCUMENTS

| EP | 1596205 A1 | 11/2005 |
| EP | 2742887 A1 | 6/2014 |
| EP | 3028658 A1 | 6/2016 |

OTHER PUBLICATIONS

C. Deng, D. Xu, C. Hu and Z. Wen, "PFC converter with novel integration of both EMI filter and Boost inductors," 2013 IEEE Energy Conversion Congress and Exposition, Denver, CO, USA, 2013, pp. 3390-3397, doi: 10.1109/ECCE.2013.6647146 (Year: 2013).*

(Continued)

*Primary Examiner* — Jermele M Hollington
*Assistant Examiner* — Robert P Alejnikov, Jr.
(74) *Attorney, Agent, or Firm* — Bookoff McAndrews, PLLC

(57) ABSTRACT

An electric circuit for measuring a current flowing in a conductor comprising: 2×N coils, N being an integer greater than or equal to 2, connected in series together; and a common mode filtering element associated with each of the 2×N coils, each filtering element being placed in parallel with the associated coil and being able to accomplish common mode filtering of the 2×N coils, a core of the 2×N coils having a relative permeability less than 10, and among the 2×N coils, N coils being wound in a direction opposite to the winding direction of the N other coils.

10 Claims, 2 Drawing Sheets

(58) Field of Classification Search
USPC .......................................................... 324/126
See application file for complete search history.

(56) References Cited

U.S. PATENT DOCUMENTS

2014/0333290 A1* 11/2014 Boudreau, Jr. ...... G01R 15/181
                                                   324/123 R
2020/0027648 A1*  1/2020 Wennerstrom ...... H01F 27/2876

OTHER PUBLICATIONS

International Search Report in International Application No. PCT/FR2021/050505, dated Nov. 3, 2021 (5 pages).
French Search Report in French Application No. 2003329, dated Nov. 27, 2020 (2 pages).
Written Opinion in International Application No. PCT/FR2021/050505, dated Nov. 3, 2021 (8 pages).

* cited by examiner

[Fig. 1]

[Fig. 2]
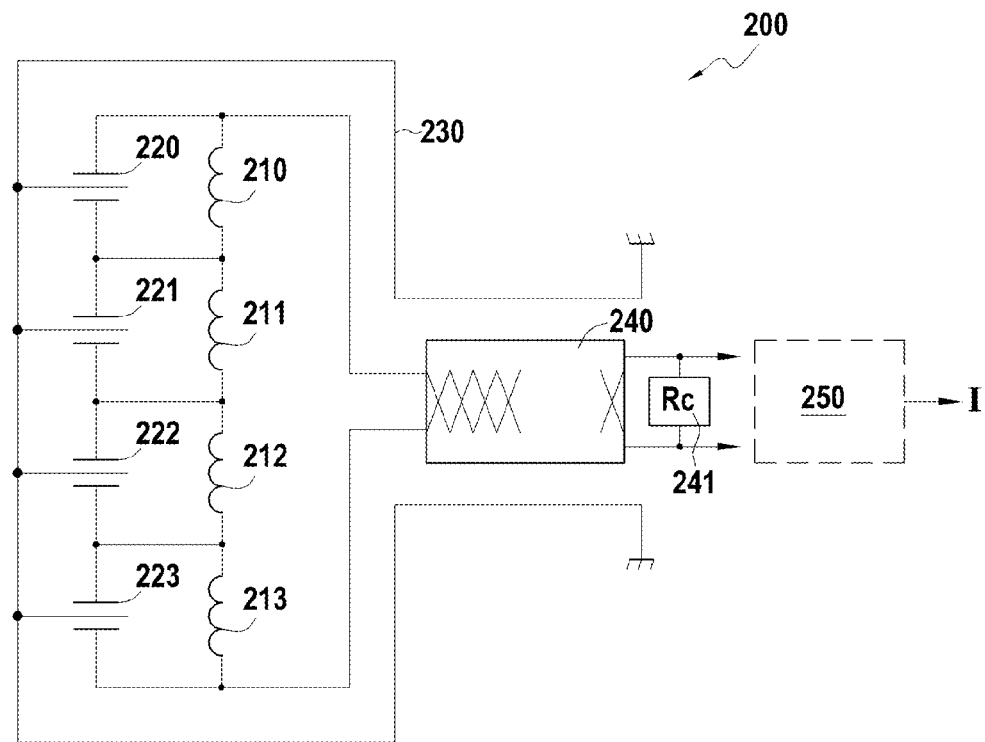
[Fig. 3]
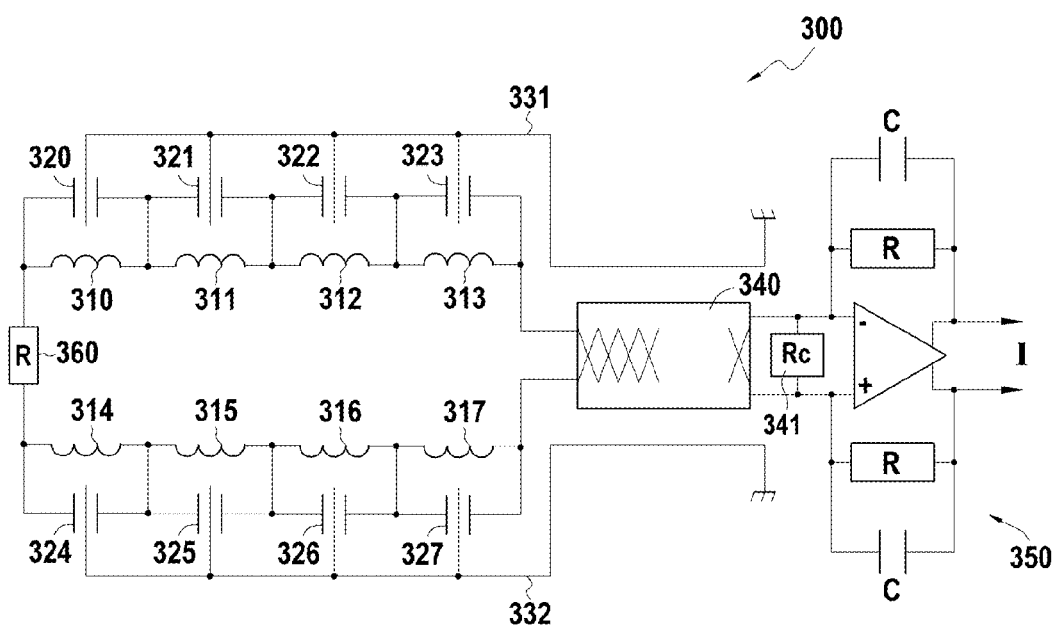

ROGOWSKI CURRENT SENSOR WHICH IS FAST AND IMMUNE TO VOLTAGE DRIFTS

CROSS-REFERENCE TO RELATED APPLICATION(S)

This patent application is a U.S. National Stage entry of International Patent Application No. PCT/FR2021/050505, filed on Mar. 24, 2021, which claims the benefit of priority to French Patent Application No. 2003329, filed on Apr. 2, 2020.

TECHNICAL FIELD

The invention relates to the measurement of current flowing in a conductor, and more particularly to the measurement of current at high frequency by Rogowski type devices.

PRIOR ART

To measure currents at high frequency, typically beyond 10 kHz, it is possible to use optical fiber sensors relying on the Faraday effect. Nevertheless, these sensors are relatively bulky and require surrounding the conductor in which the current to be measured flows many times. Moreover, they are not capable of measuring small currents (a few amperes).

There also exist current sensors of the current transformer type which allow ensuring galvanic separation between the measuring device and the measurement. For measurements at high frequency, it is necessary to have a core of high relative permeability, which makes them sensitive to direct currents which will saturate the magnetic core and thus degrade the measurement. These sensors are also bulky and of high mass.

Rogowski type current sensors also allow measuring high-frequency currents. These sensors allow determining the value of a current flowing in the conductor from a voltage generated by the current in weakly magnetic or even non-magnetic air or core coils, the voltage generated being proportional to the time derivative of the current. This type of sensor is relatively compact and insensitive to direct components of the current due to the absence of a magnetic core in the coil. The temperature accuracy of this type of sensor depends on the load impedance; the thermal drift of the internal resistance of the sensor must not be too high relative to the load impedance. High load resistances are therefore used, which are generally 100 times higher than the internal resistance of the sensor, which cause strong resonances at high frequencies in the sensors. This degrades the measurements or saturates the electronics in the event of high current variation speed.

Moreover, to immunize itself against rapid variations in voltage of the conductor, the use of an electrostatic screen is not desirable because it reduces the pass-band of the sensor.

It is therefore desirable to have a compact current measuring device suitable for high frequencies, typically beyond 10 kHz, i.e. being suitable for rapid commutation times, typically less than 10 µs, while being immune to rapid variations of voltage, current and to temperature drifts.

DISCLOSURE OF THE INVENTION

The invention relates to an electrical circuit for measuring a current flowing in a conductor, comprising:
  2×N coils, N being an integer greater than or equal to 2, connected in series together; and
  a common mode filtering element associated with each of the 2×N coils, each filtering element being placed in parallel with the associated coil and being able to accomplish common mode filtering of the 2×N coils,
  a core of the 2×N coils having a relative permeability less than 10, and among the 2×N coils, N coils being wound in a direction opposite to the winding direction of the other N coils.

By "coil" is meant a ring-shaped dipole constituted by at least one multi-turn winding delimiting an internal space of the coil. The internal space of the coil is thus the measurement space around the conductor, in which the current to be measured, delimited by the multi-turn windings of the coils, flows.

The use of the 2×N coils, with N greater than or equal to 2, allows improving the common mode rejection of the coils due to the filtering elements set in parallel with the 2×N coils. In fact, at high frequency, the common mode filtering elements are capacitive. Therefore the common mode capacitance (equivalent capacitance of the filtering elements) which allows attenuating the output current of the 2×N coils is equivalent to the capacitance formed by the set of filtering elements set in parallel. While the differential mode capacitance which limits the pass-band is equivalent to the capacitance formed by the set of filtering elements connected in series together. If the capacitance of a single filtering element is denoted C0 and it is considered that the filtering elements are identical, the common mode capacitance will be 2×N×C0 and the differential mode capacitance will be C0/(2×N). Therefore, by increasing the number of coils, which allows increasing the common mode capacitance to improve the common mode rejection while reducing the differential mode capacitance to avoid restraining the pass-band.

A certain even number of coils is used, in which half of the coils are wound in one direction and the other half in the opposite direction. This allows creating a multi-pole in which the useful signal, i.e. the electromotive force due to magnetic coupling between the current flowing in the conductor and the coils appears in differential mode; while the parasite signal, i.e. the voltage due to capacitive coupling between the potential of the conductor and the coils, appears in common mode. This also allows, due to the core of the coils being weakly magnetic (relative permeability less than 10), having an equivalent circuit to a Rogowski type coil comprising 2×N windings. Thus, it is possible to determine a current flowing in a conductor in the same manner as a Rogowski type coil. By placing the windings of the 2×N coils around a conductor in which it is desired to measure, a voltage is generated that is proportional to the time derivative of said current in the coils. By recovering this voltage at the terminals of the 2×N coils, it is therefore possible to determine the current in the conductor by integration.

According to one embodiment, the electrical circuit comprises at least one guard ring surrounding the 2×N coils and the filtering elements and connecting the filtering elements to an electrical ground.

The use of at least one guard ring allows improving common mode rejection. By surrounding the 2×N coils and the filtering elements, the guard ring encloses the circuit and ensures protection against strong fields (electromagnetic compatibility protection, called "EMC" protection). It also allows connecting the filtering elements to the electrical ground due to a trace dedicated to that purpose.

According to a particular feature of the invention, the filtering elements are three-terminal capacitors, for example those developed using X2Y® technology.

X2Y® technology capacitors are ceramic capacitors which allow reducing costs and improving filtering performance, because these capacitors are more compact, less costly and tolerate higher frequencies than traditional capacitors.

According to another particular feature of the invention, the circuit comprises a connecting cable having a shielding braid connected to the 2×N coils.

When a guard ring is used, it can also be connected to the shielding braid of the connecting cable. Due to the shielding braid, the circuit has good immunity to "EMC" perturbations.

According to another particular feature of the invention, the connecting cable is a shielded twisted pair, the impedance characteristic of which is loaded by a resistor R placed in parallel, the connecting cable being placed between the parallel resistor and the set formed by the 2×N coils and the filtering elements.

If the resistor R is weak, i.e. if it is such that the inverse of the time constant L/R is less than the frequency of the current to be measured, L being the inductance of the set of 2×N coils, a voltage directly proportional to the current flowing in the conductor is recovered at the terminals of this resistor, due to the self-integration effect.

According to one embodiment, the electrical circuit also comprises a load, the load being placed between the N coils wound in the same direction and the N other coils wound in the opposite direction.

This load allows creating impedance matching to eliminate reflections at very high frequency and thus ensure an increase in the pass-band despite the presence of a long distance transmission line. The measurement circuit thus behaves like a transmission line and allows transporting a useful signal over a long distance without differential mode deformation, while common mode perturbation currents are filtered by the filtering element due to the high equivalent capacitance.

According to a particular feature of the invention, the load is a resistor less than or equal to 100 ohms, in particular less than or equal to 75 ohms, and even more particularly less than or equal to 50 ohms.

According to another particular feature of the invention, the 2×N coils comprise only one layer of turns. This allows increasing the pass band of the measurement circuit.

According to one embodiment, the electrical circuit comprises an integrator, the inputs of which are connected to the 2×N coils.

The integrator allows integrating the output signal of the 2×N coils, particularly the voltage generated in the coils by the flow of current in the conductor, to determine the current flowing in said conductor. The inputs of the integrator are connected to the 2×N coils to accomplish differential measurement of the current flowing in the conductor.

According to another particular feature of the invention, the integrator is an operational amplifier integrator assembly.

According to another particular feature of the invention, the 2×N coils and the filtering elements are present on at least one flexible support.

According to another particular feature of the invention, the 2×N coils and the filtering elements are present on at least one printed circuit. The printed circuit is a particularly suitable support for the high number of coils of the measurement circuit.

Another object of the invention is a current sensor comprising an electrical circuit according to the invention.

According to a particular feature of the invention, the sensor comprises a conductor, the 2×N coils being wound around the conductor. This allows in particular measuring a current flowing in a conductive part or in a dielectric component or in an electrical circuit without placing this part or component or circuit in the winding of the 2×N coils due to the conductor of the sensor which is connected to this part, component or circuit.

BRIEF DESCRIPTION OF THE DRAWINGS

Other characteristics and advantages of the present invention will emerge from the description given below, with reference to the appended drawings which illustrate exemplary embodiments without any limitation.

FIG. 1 schematically and partially represents an electrical circuit for measuring a current according to one embodiment of the invention.

FIG. 2 schematically and partially represents an electrical circuit for measuring a current according to another embodiment of the invention.

DESCRIPTION OF THE EMBODIMENTS

Figure 3:
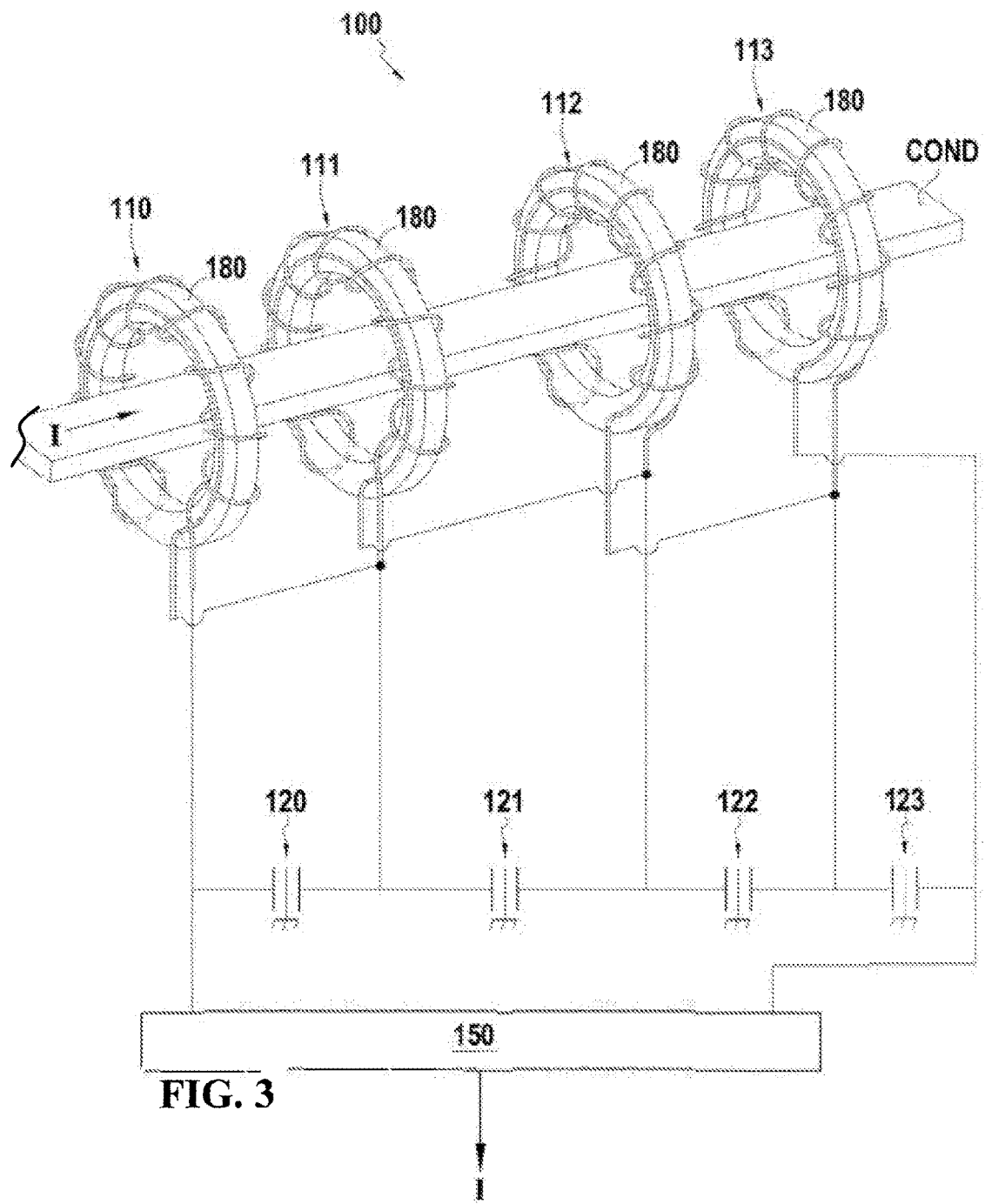
FIG. 3 schematically and partially represents an electrical circuit for measuring a current according to another embodiment of the invention.

As indicated above, by "coil" is meant a ring-shaped dipole consisting of at least one multi-turn winding delimiting an internal space of the coil as well as the measurement space around the conductor. FIG. 1 schematically and partially represents an electrical circuit 100 for measuring a current I flowing in a conductor COND according to one embodiment of the invention. This circuit 100 comprises four coils 110, 111, 112 and 113 which are intended to be wound around the conductor COND. The four coils 110, 111, 112 and 113 are connected in series together. Their core 180 has a relative permeability less than 10, their cores 180 are therefore weakly magnetic. They can also be non-magnetic. The coils 110 to 113 can also be air coils; in this case, their core 180 will be formed only of air.

The two coils 110 and 111 are wound in a first direction and the two other coils 112 and 113 are wound in the opposite direction. This allows rejecting capacitive couplings between the potential of the conductor COND and the coils 110 to 113.

Common mode filtering elements 120, 121, 122 and 123 of the coils 110 to 113 are also present in the circuit 100. A filtering element is placed in parallel with each coil. Thus, the filtering element 120 is placed in parallel with the coil 110, the filtering element 121 is placed in parallel with the coil 111, the filtering element 122 is placed in parallel with the coil 112 and the filtering element 123 is placed in parallel with the coil 113. In common mode, the assembly of the filtering elements 120 to 123 thus appears as a parallel setting of the filtering elements 120 to 123 and, in differential mode, their assembly appears as a series setting of the same elements. This allows improving common mode rejection of the coils 110 to 113 without degrading the pass-band of the measurement circuit 100.

As the core 180 of the coils 110 to 113 is weakly magnetic, as the coils 110 to 113 are wound around the conductor COND in which the current I to be measured flows and as half the coils 110 to 111 is wound in one direction and the other half 112 and 113 in another direction, the set of four coils 110 to 113 forms a Rogowski type coil. The flow of the current I in the conductor COND therefore generates a voltage in the coils 110 to 113 which is proportional to the derivative of the current I. Thus for determining the value of the current I, it is possible to integrate the voltage generated in the coils 110 to 113. To this end, the circuit 100 comprises a means 150 for processing the voltage generated by the coils 110 to 113. This processing means is for example a means of integration, placed at the output of the coils 110 to 113, and of their associated filtering elements 120 to 123.

According to a particular feature of the invention, the filtering elements 120 to 123 are capacitive elements, and more particularly are ceramic X2Y® capacitors. The use of X2Y® capacitors allows creating a less costly and more compact measurement circuit 100 able to tolerate higher frequencies than a circuit created with traditional capacitors.

Moreover, denoting by C0 the capacitance of the X2Y® capacitors, the common mode capacitance, i.e. the equivalent capacitance of the filtering elements in the common mode, is equal to 4×C0. The filtering elements therefore allow significantly attenuating the common mode perturbation current at the output of the set of coils 110 to 112 and of the filtering elements 120 to 123. The differential mode capacitance is equal to C0/4, the differential mode perturbation current is therefore reduced.

According to another particular feature of the invention, the circuit 100 comprises 2×N coils with N an integer greater than or equal to 2. Among the 2×N coils, N coils are wound in a first direction and the N other coils are wound in the opposite direction. The increase in the number of coils also allows increasing the number of filtering elements in parallel with the coils, and therefore improving common mode rejection. In fact, with 2×N coils, the equivalent capacitance in common mode will be equal to 2×N×C0 while the equivalent capacity in differential mode will be equal to C0/(2×N). The common mode perturbation at the output of the set of coils and of the filtering elements will therefore be significantly reduced, while the useful signal (in differential mode) will be slightly affected.

According to another particular feature of the invention, the coils 110 to 113 comprise turns distributed over a single layer, i.e. they comprise a single layer of multi-turn winding.

FIG. 2 schematically and partially represents an electrical circuit 200 for measuring a current I according to another embodiment of the invention.

The circuit 200 comprises four coils 210, 211, 212 and 213 connected in series and each connected in parallel to a common mode filtering element 220, 221, 222 and 223 of the coils 210 to 213. As previously described, the core of the coils 210 to 213 is weakly magnetic, i.e. the relative permeability of its core is less than 10, or even 2, or even 1.1. Two of the four coils are wound in a first direction and the two others in the opposite direction. The coils thus create a Rogowski type device for measuring a current flowing in a conductor. For reasons of clarity in the figure, the conductor is not represented in FIG. 2.

The circuit 200 also comprises a guard ring 230 connected to an electrical ground and surrounding the filtering elements 220 to 223 and the coils 210 to 213. Each filtering element 220 to 223 is connected to the guard ring 230, and are thus connected to the electrical ground. By surrounding them, the guard ring 230 allows distributing homogeneously the filtering elements 220 to 223 and thus protecting the coils 210 to 213 from electromagnetic perturbations. It also allows grounding the filtering elements 220 to 223 due to a dedicated trace. It thus improves common mode rejection.

The circuit 200 also comprises a connecting cable 240 comprising a shielding braid which allows eliminating the reflections of the possible electronics 250 which determines the current I that it is desired to measure, toward the coils 210 to 213 and the filtering elements 220 to 223.

According to a particular feature of the invention, the connecting cable 240 is a shielded twisted pair, the characteristic impedance of which is loaded by a resistor 241 placed in parallel. The resistor 241 is placed at the output of the connecting cable 240.

According to another particular feature of the invention, the guard ring 230 also surrounds the connecting cable 240.

According to another particular feature of the invention, the value of the resistor 241 is low, i.e. it is such that the inverse of the time constant L/R is less than the frequency of the current to be measured, with R the value of the resistor 241 and L the inductance of the 2×N coils. This allows obtaining at the output of the shielding braid of the connecting cable 240 and of the resistor 241 a current that is directly proportional to the current I that it is desired to measure in the conductor. Thus, the possible electronics 250 connected to the measurement circuit 200, which allows determining the value of the current I flowing in the conductor, does not carry out any integration function for determining the current I.

FIG. 3 schematically and partially represents an electrical circuit 300 for measuring a current I flowing in a conductor according to another embodiment of the invention. For reasons of clarity in the figure, the conductor is not represented in FIG. 3.

The circuit 300 comprises eight coils 310 to 317. The coils 310 to 313 are wound in a first direction and the coils 314 to 317 are wound in the opposite direction. A resistor 360 separates these two groups of coils. The coils 310 to 313 are connected in series together and are connected in series to the resistor 360. The coils 314 to 317 are connected in series together and are connected in series to the resistor 360. A common mode filtering element 320 to 327 is placed in parallel with each of the coils 310 to 317.

The core of the coils 310 to 317 is weakly magnetic, therefore its relative permeability is less than 10. As previously indicated, the coils 310 to 317 form a Rogowski type device.

The circuit 300 comprises a connecting cable 340 comprising a shielding braid connected to the coils 310 to 317 as well as a resistor 341 placed in parallel with the shielding braid. An integrator 350 is present in the circuit following the resistor 341. The integrator 350 is more particularly an operational amplifier integrator assembly which allows determining the value of the current I. The inputs of the integrator are connected to the coils 310 to 317 by the resistor 341 and the shielding braid of the connecting cable 340, to accomplish measurement of the current I differentially.

The resistor 360 allows obtaining, at the output of the connecting cable 340 and of its parallel resistor 341 (and at the output of the coils 310 to 317) a signal with low impedance. The electronics 350 can therefore have low impedance. The value of the resistor 360 is for example 100 ohms.

The circuit 300 also comprises two guard rings 331 and 332 surrounding the coils 310 to 317, the filtering elements 320 to 327 and the connecting cable 340. The two guard rings 331 and 332 are connected to an electrical ground. The guard ring 331 is connected to the filtering elements 320 to 323 and connects these elements to the electrical ground.

The guard ring 332 is connected to the filtering elements 324 to 327 and connects these elements to the electrical ground.

According to another particular feature of the invention, the coils and the common mode filtering elements of the coils are present on at least one flexible support.

According to another particular feature of the invention, the coils and the common mode filtering elements of the coils are present on at least one printed circuit. The printed circuit is a particularly suitable support for the large number of coils for creating a compact measurement circuit.

The invention also relates to a current sensor comprising a measurement circuit as described previously. The conductor in which the current to be measured flows is placed in the winding of the coils of the measurement circuit.

According to a particular feature of the invention, the sensor comprises a conductor placed in the winding of the coils. In this manner, if it is desired to measure the current flowing in a conductive part or in an electrical component or in an electrical circuit external to the sensor and/or which cannot be placed in the winding of the coils, it is sufficient to connect this part, component or circuit to the conductor of the sensor, so that the current flowing in this part, component or circuit also flows in the conductor of the sensor.

The invention claimed is:

1. An electrical circuit for measuring a current flowing in a conductor comprising:
   2×N coils, N being an integer greater than or equal to 2, connected in series together; and
   a common mode filtering element associated with each of the 2×N coils, each filtering element being placed in parallel with the associated coil and being able to accomplish common mode filtering of the 2×N coils, a core of the 2×N coils having a relative permeability less than 10, and among the 2×N coils, N coils being wound in a direction opposite to the winding direction of the other N coils.

2. The electrical circuit according to claim 1, wherein the 2×N coils comprise only one layer of turns.

3. The electrical circuit according to claim 1, comprising at least one guard ring surrounding the 2×N coils and the filtering elements and connecting the filtering elements to an electrical ground.

4. The electrical circuit according to claim 1, wherein the filtering elements are three-electrode capacitors.

5. The electrical circuit according to claim 1, also comprising a connecting cable comprising a shielding braid connected to the 2×N coils.

6. The electrical circuit according to claim 1, also comprising a load, the load being placed between the N coils wound in the same direction and the N other coils wound in the opposite direction.

7. An electrical circuit according to claim 1, comprising an integrator the inputs of which are connected to the 2×N coils.

8. The electrical circuit according to claim 1, wherein said 2×N coils and said filtering elements are present on at least one printed circuit.

9. A current sensor comprising an electrical circuit according to claim 1.

10. A current sensor according to claim 9, comprising a conductor, the 2×N coils being wound around said conductor.

* * * * *